United States Patent [19]
Bui

[11] Patent Number: 5,808,361
[45] Date of Patent: Sep. 15, 1998

[54] INTERGRATED CIRCUIT INTERCONNECT VIA STRUCTURE HAVING LOW RESISTANCE

[75] Inventor: Nguyen Duc Bui, San Jose, Calif.

[73] Assignee: Advanced Micro Devices, Inc., Sunnyvale, Calif.

[21] Appl. No.: 799,560

[22] Filed: Feb. 10, 1997

[51] Int. Cl.$^6$ .......................... H01L 23/48; H01L 23/52; H01L 29/40

[52] U.S. Cl. .......................... 257/750; 257/758; 257/760; 257/762; 257/763

[58] Field of Search .................... 257/750, 774, 257/763, 700, 758, 760, 762; 438/533, 622

[56] References Cited

U.S. PATENT DOCUMENTS

| | | | |
|---|---|---|---|
| 4,626,479 | 12/1986 | Hosoi et al. | 257/750 |
| 4,874,719 | 10/1989 | Kurosawa | 257/750 |
| 4,916,521 | 4/1990 | Yoshikawa et al. | 257/760 |
| 5,132,775 | 7/1992 | Brighton et al. | 257/750 |
| 5,554,888 | 9/1996 | Kato | 257/750 |
| 5,561,327 | 10/1996 | Jun | 257/773 |
| 5,565,707 | 10/1996 | Colgan et al. | 257/750 |
| 5,668,413 | 9/1997 | Nanjo | 257/758 |

*Primary Examiner*—Olik Chaudhuri
*Assistant Examiner*—Phat X. Cao
*Attorney, Agent, or Firm*—H. Donald Nelson

[57] ABSTRACT

Interconnect via structures in a semiconductor integrated circuit having low resistance. The interconnect via structures connect metal layer structures in the semiconductor device and extend down at least one side of the metal layer structures. The interconnect via structures can extend down a second side of the metal layer structures and can extend down the end of the metal layer structures. The interconnect via structures extend beyond the sides and the end of the metal layer structures by a distance u where u is ¼ to ½ F, where F is a feature of the design rule being used to manufacture the semiconductor device.

8 Claims, 5 Drawing Sheets

INTERGRATED CIRCUIT INTERCONNECT VIA STRUCTURE HAVING LOW RESISTANCE

BACKGROUND OF THE INVENTION

1. Field of the Invention

This invention relates generally to a high performance semiconductor device and more particularly, to a high performance semiconductor device with interconnect via structures having low resistance. The interconnect via structures connect metal layers in the semiconductor device.

2. Discussion of the Related Art

The semiconductor industry is increasingly characterized by a growing trend toward fabricating larger and more complex circuits on a given semiconductor chip. To achieve the higher performance required by end users of semiconductors, such as computer users, it is necessary for the semiconductor manufacturers to provide faster and smaller integrated circuits in faster chips. In addition, end users of semiconductors have demanded more functions on smaller chips. This, for example, has resulted in the requirement to increase the density of transistors on chips on each new generation of semiconductors. The increased density has been achieved by reducing the size of individual devices within the circuits and spacing the devices closer together.

There is increasing interest in MOS integrated circuits in which the component devices have gate dimensions smaller than 0.25 μm. Devices having such small dimensions suffer from certain problems that are not of serious concern when the gate dimensions are greater than about 1 μm. Two of the major goals of MOSFET scaling are to increase the density and the speed of the integrated circuits in which the scaled-down devices are to be used. To increase density, the physical dimensions of each integrated circuit have to be reduced which means smaller channel lengths and widths. As the physical dimensions of the integrated circuit reached the submicron regime, all of the device parameters that affect performance of the integrated circuit have become extremely critical. One of the parameters that has become critical is the contact technology used in these integrated circuits. The contact technology is critical because as silicon integrated circuits are fabricated, isolated active regions are created within the single-crystal substrate. These active regions must be connected to other regions of the device, both with other regions of the substrate and with other regions in layers above the substrate. These connections are made with high-conductivity, thin-film structures which are fabricated above an insulator which has been fabricated above the active regions. Whenever a connection is needed between a conductor film and one of the active regions, an opening in the insulator must be provided to allow such a contact to occur. Although interconnections in ideal electric circuits are assumed to have zero impedance, in real semiconductor structures the finite impedance must be considered. For example, in the sixth generation of microprocessors, there is on the order of 4 million transistors. For each transistor there are one or more interconnect via structures. The current flowing through each via is on the order of milliamperes. Since each prior art interconnect via structure has approximately 10 ohms resistance for a sub-half-micron via with a tungsten plug, the total power generated by the interconnect via structures, assuming 8 million interconnect via structures, is:

$$\text{Power} = I^2 R = (10^{-3})^2 \times 8 \times 10^6 \times 10 = 80 \text{ watts.}$$

As can be appreciated, 80 watts is a substantial amount of dc power generated on a microprocessor chip that must be dissipated by the chip.

Hence, what is needed is an interconnect via structure that has substantially less than the resistance of the prior art interconnect via structures.

SUMMARY OF THE INVENTION

The present invention is directed to an interconnect via structure having low resistance in a semiconductor integrated circuit. The interconnect via structure connects a first metal layer structure to a second metal layer structure which overlies the first metal layer structure. The interconnect via structure is made of an electrically conductive material and extends down at least one side of the first metal layer structure substantially to the bottom surface of the first metal layer structure.

The interconnect via structure can extend down a second side of the first metal layer structure substantially to the bottom surface of the first metal layer structure.

The interconnect via structure also can extend down the end of the first metal layer structure substantially to the bottom surface of the first metal layer structure.

The interconnect via structure extends beyond the edge of the sides and the end of the first metal layer structure by a distance u where u is ¼ to ½ F, where F is a feature of the design rule being used to manufacture the semiconductor integrated circuit.

The present invention is further directed to a stacked interconnect via structure where the interconnect structure extends above the top surface of the second metal layer structure. The interconnect material extends down one side or both sides and/or the end of the second metal layer structure as well as one side or both sides and/or the end of the first metal layer structure. The interconnect via structure extends beyond the edge of the sides and the end of the second metal layer by a distance u where u is ¼ to ½ F, where F is a feature of the design rule being used to manufacture the semiconductor integrated circuit.

The present invention is better understood upon consideration of the detailed description below, in conjunction with the accompanying drawings. As will become readily apparent to those skilled in the art from the following description there is shown and described embodiments of this invention simply by way of illustration of the best modes to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings:

FIG. 13A is a side view of a second stacked via structure and is the ninth embodiment of the present invention where the interconnect via structure extends down one side of a first metal layer structure and extends to a second metal layer structure underlying the first metal layer and the interconnect via structure extends down one side of the second metal layer structure.

FIG. 13B is the top view of a first embodiment of the second stacked via structure shown in FIG. 13A where the interconnect via structure extends down one side and the end of each of the first and second metal layer structures.

FIG. 13C is the top view of a second embodiment of the second stacked via structure shown in FIG. 13A where the interconnect via structure extends down one side of each of the first and second metal layer structures.

DETAILED DESCRIPTION

Reference is now made in detail to specific embodiments of the present invention which illustrate the best modes presently contemplated by the inventor for practicing the invention.

Figure 1:
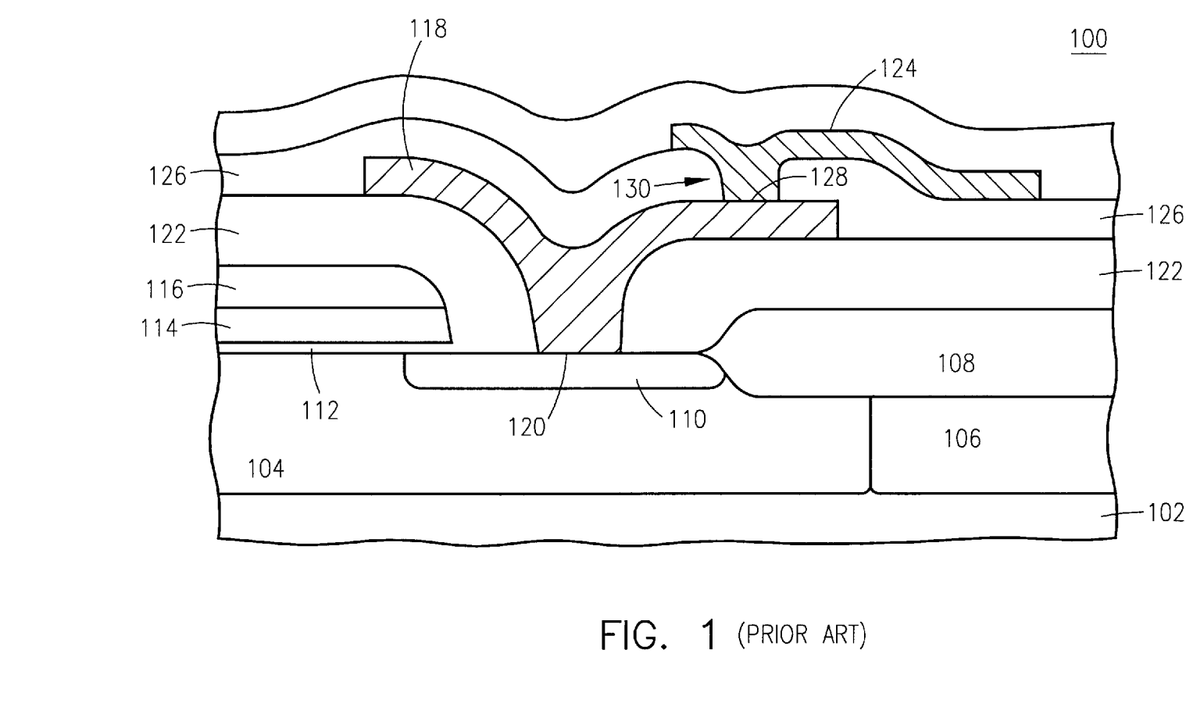
FIG. 1 is a portion of a representative two-metal layer semiconductor device illustrating the terminology of the various layers and structures in a semiconductor device.

Referring to FIG. 1 there is shown a portion of a typical multilevel-interconnect semiconductor structure and in this case the structure 100 is a two metal layer structure utilized for MOS technologies. It is to be understood that the portion of the semiconductor structure 100 shown in FIG. 1 is for illustrative purposes only and other types of structures having two or more metal layers could be shown. The semiconductor structure 100 is formed on a semiconductor substrate 102 in which regions of different electrical conductivities are formed by implanting or diffusing appropriate dopants into selected regions. For example, the region 104 could be a formed as a p type conductivity region by implanting or diffusing p type dopants into the region and the region 106 could be formed as an n type conductivity region by implanting or diffusing n type dopants into the region. The method of forming such conductivity regions is well known in the semiconductor art and will not be discussed. The semiconductor structure 100 typically includes a field oxide region 108, a high conductivity region 110 which could be an n+ or a p+ region and which could be a source or drain region in an MOS device. An MOS device would include a gate oxide region 112, a polysilicon gate 114, and a silicide region 116 formed on the polysilicon gate 114. A first metal layer 118 provides a metal to silicon electrical contact at 120. An MOS structure has a dielectric layer 122 between the polysilicon gate 114 level and the first metal layer 118 and such a dielectric layer 122 is known in the semiconductor art as the polysilicon/Metal 1 dielectric (PMD) layer. A second metal layer 124 is separated from the first metal layer 118 by a dielectric layer 126 except at selected locations such as 128 where electrical contact is purposely made between the first metal layer 118 and the second metal layer 124. The dielectric layers between metal layers, such as dielectric layer 126, are known as intermetal dielectric layers. The intermetal dielectric layer between the first metal layer 118 and the second metal layer 124 is designated the DM1 layer. If there are additional metal layers, the intermetal dielectric layers between succeeding metal layers are designated DM2, DM3, etc. The openings in the polysilicon/Metal 1 dielectric layer 122, such as the opening allowing contact to the source/drain region 110, are referred to as contact holes. Contacts through the contact holes are established between the first metal layer 118 and polysilicon, such as a polysilicon gate, as well as between the first layer 118 and the silicon substrate at 120. Openings in the intermetal dielectric layers, such as the opening indicated at 130 in the intermetal dielectric layer 126, are known as vias. The vias allow contacts to be made between the metal layers. In bipolar technology, the dielectric layer between the first metal layer and the substrate is still referred to as PMD, despite the fact that the PMD layer may not isolate the first metal layer from a polysilicon region. The openings in the PMD layer are also called contact holes in bipolar technology, although they are only used to allow contact to be established between the Metal 1 and the silicon substrate, not polysilicon. The notation for the other metal and dielectric layers in bipolar technology is the same as for MOS technology.

Figure 2A:
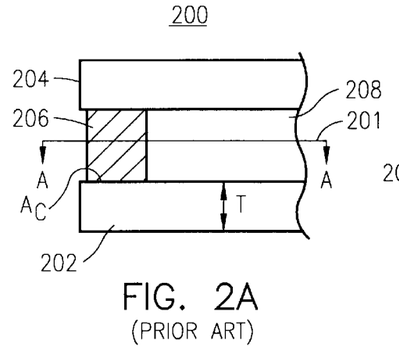
FIGS. 2A & 2B are a side view and the top view, respectively, of a first example of a prior art interconnect device where the interconnect via structure has a smaller cross-section than the top surface of the underlying metal layer structure.
Figure 2B:
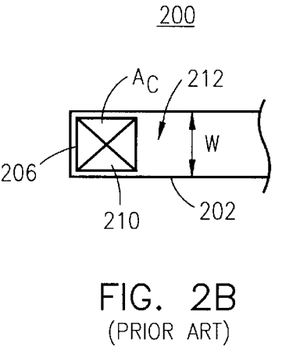
Figure 2C:
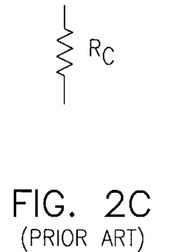
FIG. 2C is a representation of the resistance of the prior art interconnect via structure shown in FIGS. 2A & 2B.

FIGS. 2A & 2B show a side view and a top view, respectively, of a prior art device 200 having a first metal layer 202, a second metal layer 204, and an interconnect via structure 206 electrically connecting the first metal layer 202 to the second metal layer 204. The first metal layer 202 has a height T and is electrically insulated from the second metal layer 204 by the intermetal dielectric layer 208, except where the interconnect via structure 206 makes contact with the second metal layer 204. Referring to FIG. 2B which is a view of section AA 201 in FIG. 2A, the cross-section 210 of the interconnect via structure 206 is shown having a smaller cross-section than the top surface 212 of the first metal layer 202. The cross-section of the interconnect via structure 206 is indicated by a large X and this notation will be used in subsequent figures to indicate the interconnect via structure. The contact area of the cross-section 210 is indicated by $A_C$. The top surface 212 of the first metal layer 202 has a width W and, therefore, the cross-section 210 of the interconnect via structure 206 has cross-sectional dimensions each of which is less than W. The interconnect via structure 206 is shown connected to an end of the first metal layer 202 and to an end of the second metal layer 204. Other connection locations are possible, for example, at intermediate locations along the length of either the first metal layer 202 or the second metal layer 204. FIG. 2C indicates that the resistance of the interconnect via 206 is equal to $R_C$.

Figure 3A:
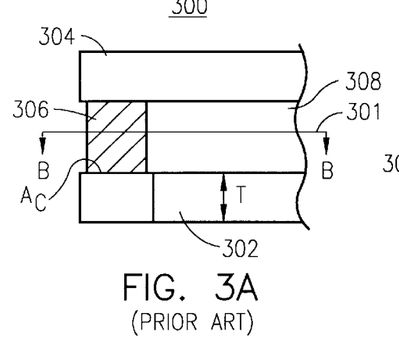
FIGS. 3A & 3B are a side view and the top view, respectively, of a second example of a prior art interconnect device where the underlying metal layer surface has a larger cross-section at the interconnect site and the interconnect via structure has a smaller cross-section than the top surface of the underlying metal layer structure.
Figure 3B:
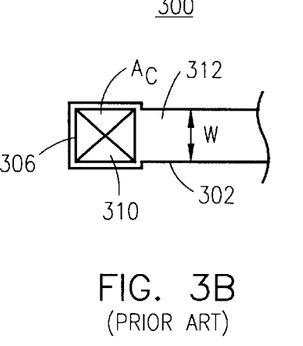
Figure 3C:
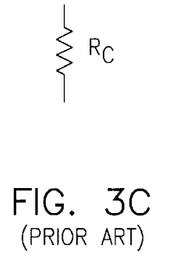
FIG. 3C is a representation of the resistance of the prior art interconnect via structure shown in FIGS. 3A & 3B.

Referring to FIGS. 3A & 3B there is shown a second prior art device 300 having a first metal layer 302, a second metal layer 304, and an interconnect via structure 306 electrically connecting the first metal layer 302 to the second metal layer 304. The first metal layer 302 is electrically insulated from the second metal layer 304 by an intermetal dielectric layer 308, except where the interconnect via structure 306 makes contact with the second metal layer 304. Referring to FIG. 3B which is a view of section BB 301 in FIG. 2A, the cross-section 310 of the interconnect via structure 306 is shown. The metal layer 302 has a wider cross-section at the site of the connection with the interconnect via structure 306. The interconnect via structure 306 has cross-sectional dimensions that can be approximately equal to the width W of the first metal layer 302. The cross-section 310 of the interconnect via structure 308 is smaller than the cross-section of the top surface of the first metal layer 302 at the site of the connection. The interconnect via structure 306 is shown connected to an end of the first metal layer 302 and to an end of the second metal layer 304. Other connection locations are possible, for example, at intermediate locations along the length of either the first metal layer 304 or the second metal layer 304. FIG. 3C indicates that the resistance of the interconnect via structure 306 is equal to $R_C$.

Figure 4A:
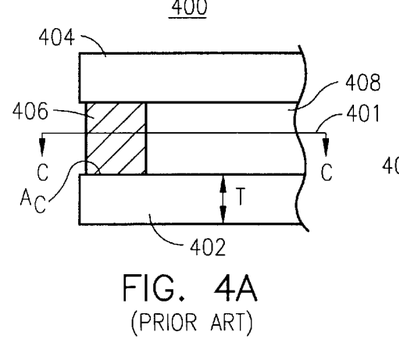
FIGS. 4A & 4B are a side view and the top view, respectively, of a third example of a prior art interconnect device where the interconnect via structure has a cross-section that is equal to the cross-section of the underlying metal layer structure.
Figure 4B:
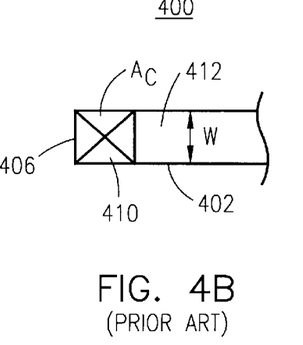
Figure 4C:
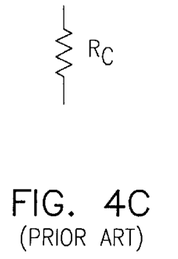
FIG. 4C is a representation of the resistance of the prior art interconnect via structure shown in FIGS. 4A & 4B.

Referring to FIGS. 4A & 4B there is shown a third prior art device 400 having a first metal layer 402, a second metal layer 404, and an interconnect via structure 406 electrically connecting the first metal layer 402 to the second metal layer 404 by the intermetal dielectric layer 408, except where the interconnect via structure 406 makes contact with the second metal layer 404. Referring to FIG. 4B which is a view of section CC 401 in FIG. 4A, the cross-section 410 of the interconnect via structure 406 is shown and has the same cross-section as the top surface 412 of the first metal layer 402. The contact area of the cross-section 410 is indicated by $A_C$. The top surface 412 of the first metal layer 402 has a width W and, therefore, the cross-section 410 of the interconnect via 406 has cross-sectional dimensions each of which is approximately W. The interconnect via structure 406 is shown connected to an end of the first metal layer 402 and to an end of the second metal layer 404. Other connection locations are possible, for example, at intermediate locations along the length of either the first metal layer 402 or the second metal layer 404. FIG. 4C indicates that the resistance of the interconnect via structure 406 is equal to $R_C$.

Figure 5A:
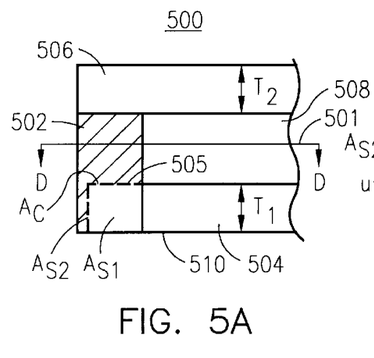
FIGS. 5A & 5B are a side view and the top view, respectively, of the first embodiment of the present invention where the interconnect via structure has a larger cross-section than the underlying metal layer structure and where the interconnect via structure extends down both sides and the end of the underlying metal layer structure.
Figure 5B:
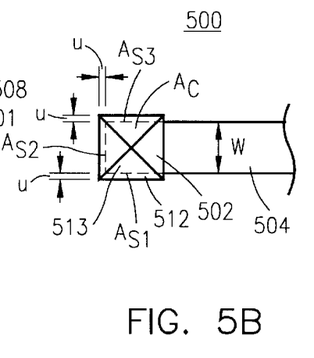

FIGS. 5A & 5B show a side view and the top view, respectively, of a portion of a semiconductor device 500 having an interconnect via structure 502 in accordance with a first embodiment of the present invention. The interconnect via structure 502 electrically connects a first metal layer structure 504 to a second metal layer structure 506. The connection between the interconnect via structure 502 and the top surface 505 of the first metal layer structure 504 results in a surface contact area $A_C$. The surface contact area $A_C$ of the structure 500 shown in FIG. 5A & 5B corresponds roughly to the surface contact area $A_C$ of the prior art devices shown in FIGS. 2A & B, 3A & B, and 4A & B. The first metal layer structure 504 has a height $T_1$ and the second metal layer structure 506 has a height $T_2$. The first metal layer structure 504 is electrically insulated from the second metal layer structure 506 by the intermetal dielectric layer 508 except where the interconnect via structure 502 makes electrical contact with the first metal layer structure 504 and the second metal layer structure 506. The interconnect via structure 502 is shown in FIGS. 5A & 5B extending down the sides and the end of the first metal layer structure 504. The extension of the interconnect via structure 502 down the end of the first metal layer structure 504 is substantially to the bottom surface 510 of the first metal layer structure 504 and results in a surface contact area $A_{S2}$ between the interconnect via structure 502 and the first metal layer structure 504. The extension of the interconnect via structure 502 down the sides of the first metal layer structure 504 is substantially to the bottom surface 510 of the first metal layer structure 504 and results in a surface contact area $A_{S1}$ on one side of the first metal layer structure 504 and a surface contact area $A_{S3}$ on the other side of the first metal layer structure 504. The contact surface areas $A_C$, $A_{S1}$, $A_{S2}$, and $A_{S3}$ are approximately equal to W×W, $T_1$×W, $T_1$×W, and $T_1$×W, respectively, where W is the width of the first metal layer 504 and $T_1$ is the height of the first metal layer 504. The cross-section of the interconnect via structure is approximately square, that is W×W, however, other cross-sectional shapes can be used.

The two groups of materials employed in multilevel-interconnect technologies are thin-film conductors and thin-film insulators. There are many requirements that must be satisfied by a conductor material that is to be used in a semiconductor device. Some are quite stringent and all must be satisfied. Thus the number of materials that have been found suitable is small. One of the more important properties is that the material must have a low resistivity value, generally less than 4 μΩ-cm (micro ohms-cm). Another of the key properties of a suitable conductor material is the ability of the material to adhere to Si (silicon) and $SiO_2$ (silicon dioxide). In this respect, Al (aluminum), Ti (titanium), Ti:W(titanium-tungsten alloy), and TiN (titanium nitride) films are considered to be among the best materials. Al and Ti reduce $SiO_2$ to form interfacial metal-oxide bonds that promote adhesion and stability. $WSi_2$, $MoSi_2$(Mo=molybdenum), and $TiSi_2$ also adhere well to $SiO_2$, but not as well as Al and Ti. Tungsten (W) and molybdenum (Mo) do not reduce $SiO_2$, and therefore they exhibit poor adhesion to $SiO_2$ surfaces and, as a result, W and Mo are not used as stand-alone conductor materials. If W and Mo films are to be used, a layer such as Ti, Ti:W, or $TiN_x$ is used under the W and Mo films to promote adequate adhesion to Si and $SiO_2$. The process methods of depositing such films are well known in the semiconductor art and will not be discussed.

Dielectric materials are used to electrically isolate one level of a conductor from another in a multilevel-interconnect system. As in the case for suitable conductor materials, the list of properties that are required for suitable dielectric materials is long and stringent. In addition, there is a significant difference between the requirements for suitable dielectric films for the PMD layer 122 (FIG. 1) and the dielectric films that are formed between the metal layers, for example, between metal layers 118 and 124 (FIG. 1). For example, doped CVD (chemical vapor deposition) $SiO_2$ films have been used extensively as PMD layers in MOS ICs. Other films that have been used for the PMD layer are silicon-nitride films and high-temperature CVD-oxide films. However, these films either cannot be flowed or reflowed or cannot be doped because of the high temperature at which they are deposited. Other films that have gained some success are undoped TEOS films which are deposited by the decomposition of tetraethyl orthosilicate (TEOS). Other films have been used and it is to be understood that the present invention is not restricted to the specific dielectric films discussed above.

Until recently, the materials most widely used for intermetal dielectrics have been doped, silane-based CVD $SiO_2$ films. These films have been used for two main reasons: first, CVD $SiO_2$ films with good electrical and physical properties can be deposited at a temperature compatible with the presence of Al on the wafer, and second, when CVD $SiO_2$ is doped with phosphorus, it serves as an excellent gettering layer for sodium ions and other lifetime-killing metallic impurities. The intermetal $SiO_2$ films can be deposited by a number of CVD processes, including atmospheric CVD, low-pressure CVD, and plasma-enhanced CVD. Other materials, known in the semiconductor art can also be used and it is to be understood that the present invention is not restricted to the specific dielectric films discussed above.

Figure 5C:
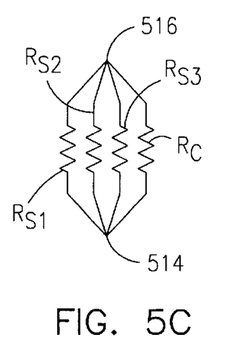
FIG. 5C is a representation of the resistance of the interconnect via structure shown in FIGS. 5A & 5B.

Referring to FIG. 5B which is a view of section DD 501 in FIG. 5A, the cross-section 512 (bounded by solid lines) of the interconnect via structure 502 has a larger cross-section than the top surface 513 (bounded by dashed lines on three sides) of the first metal layer structure 504. The cross-section 512 of the interconnect via structure 502 is larger in cross-section than the cross-section of the top surface 513 of the first metal structure 504 because the interconnect via structure 504 because the interconnect via structure 502 extends beyond the end and each side of the first metal layer structure 504. The amount the interconnect via structure 502 extends beyond the end and sides of the first metal layer structure 504 is denoted as "u" where u is equal to ¼ to ½ F, where F is a feature of the design rule being used to manufacture the semiconductor device. For example, if the process is a 0.25 μprocess (a 0.25 micron process) F would be equal to 0.25μ. Therefore, u would be equal to ¼ to ½×0.25μ. FIG. 5C indicates that the total resistance of the interconnect via structure 502 is represented by four resistance values connected in parallel between the first metal layer structure 504 and the second metal layer structure 506. The point 514 represents the connection to the first metal layer structure 504 and the point 516 represents the connection to the second metal layer structure 506. The resistance between the interconnect via structure 502 and the top surface 505 of the first metal layer structure 504 is $R_C$, the resistance between the interconnect via structure 502 and one side of the first metal layer structure 504 is $R_{S1}$, the resistance between the interconnect via structure 502 and the end of the first metal layer structure 504 is $R_{S2}$, and the resistance between the interconnect via structure 502 and the other side of the first metal layer structure 504 is $R_{S3}$. The resistance between the interconnect via structure 504 and the first metal layer structure 504 is determined by the relationship: $1/R = 1/R_C + \Sigma 1/R_{Si}$; where R is the total resistance between the interconnect via structure and the metal layer structure, $R_C$ is the resistance between the top surface of the metal layer structure 504 and the interconnect via structure 502, and $R_{Si}$ is the resistance between side i of the metal layer structure 504 and the interconnect via structure 502. Therefore, the total resistance value R between point 514 and point 516 in FIG. 5C (which is the total resistance of the interconnect via structure 502) is calculated as follows:

$$1/R = 1/R_C + 1/R_{S1} + 1/R_{S2} + 1/R_{S3}.$$

Recalling that $R_C$ is the resistance of an equivalent prior art interconnect via structure and if we assume that $R_{S1}$, $R_{S2}$, and $R_{S3}$ are approximately equal to $R_C$, the total resistance R would be ¼ the value of $R_C$, the resistance of the prior art interconnect via structure.

Figure 6A:
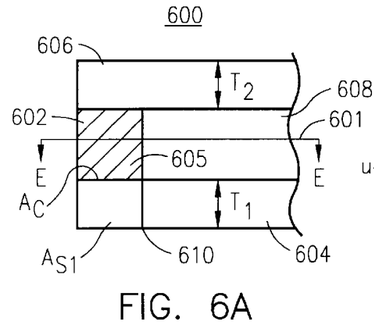
FIGS. 6A & 6B are a side view and the top view, respectively, of the second embodiment of the present invention where the interconnect via structure has a larger cross-section than the underlying metal layer structure and where the interconnect via structure extends down both sides of the underlying metal layer structure.
Figure 6B:
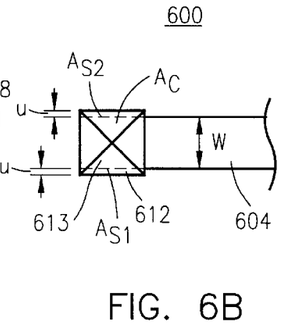
Figure 6C:
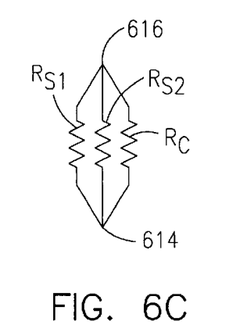
FIG. 6C is a representation of the resistance of the interconnect via structure shown in FIGS. 6A & 6B.

FIGS. 6A & 6B show a side view and the top view, respectively, of a semiconductor device 600 having an interconnect via structure 602 in accordance with a second embodiment of the present invention. The interconnect via structure 602 electrically connects a first metal layer structure 604 to a second metal layer structure 606. The connection between the interconnect via structure 602 and the top surface 605 of the first metal layer structure 604 results in a surface contact area $A_C$. The surface contact area $A_C$ of the structure 600 shown in FIGS. 6A & B corresponds roughly to the surface contact area $A_C$ of the prior art devices shown in FIGS. 2A & B, 3A & B, and 4A & B. The first metal layer structure 604 has a height $T_1$ and the second metal layer 606 has a height $T_2$. The first metal layer structure 604 is electrically insulated from the second metal layer structure 606 by the intermetal dielectric layer 608 except where the interconnect via structure 602 is in electrical contact with the first metal layer structure 604 and the second metal layer structure 606. The interconnect via structure 602 is shown in FIGS. 6A & B extending down the sides of the first metal layer structure 604. The extension of the interconnect via structure 602 down the sides of the first metal layer structure 604 is substantially to the bottom surface 610 of the first metal layer structure 604 and results in surface contact areas $A_{S1}$ and $A_{S2}$ between the interconnect via structure 602 and the first metal layer structure 604. The contact surface areas $A_C$, $A_{S1}$, and $A_{S2}$ are approximately equal to W×W, $T_1$×W, and $T_1$×W, respectively, where W is the width of the first metal layer structure 604 and $T_1$ is the height of the first metal layer structure 604. The cross-section of the interconnect via structure 602 is approximately square with dimensions W×W, however, other cross-sectional shapes can be used. Referring to FIG. 6B which is a view of section EE 601 in FIG. 6A, the cross-section 612 (bounded by solid lines) of the interconnect via structure 602 has a larger cross-section than the top surface 613 (bounded by dashed lines on two sides) of the first metal layer structure 604. The cross-section 612 of the interconnect via structure 602 is larger in cross-section than the cross-section of the top surface 613 of the first metal layer structure 604 because the interconnect via structure 602 extends beyond each side of the first metal layer structure 604. The amount the interconnect via structure 602 extends beyond the sides of the first metal layer 604 is denoted by "u" where u is equal to ¼ to ½ F, where F is a feature of the design rule being used to manufacture the semiconductor device as discussed above in conjunction with FIGS. 5A & B. FIG. 6C indicates that the total resistance of the interconnect via structure 602 is represented by three resistance values connected in parallel between the first metal layer structure 604 and the second metal layer structure 606. The point 614 represents the first metal layer structure 604 and the point 616 represents the second metal layer structure 606. The resistance between the interconnect via structure 602 and the top surface 605 of the first metal layer structure 604 is $R_C$, the resistance between the interconnect via structure 602 and one side of the first metal layer structure 604 is $R_{S1}$ and the resistance between the interconnect via structure 602 and the other side of the first metal layer structure 602 and the other side of the first metal layer structure 604 is $R_{S2}$. The total resistance value R between the point 614 and the point 616 in FIG. 6C is calculated as follows:

$$1/R = 1/R_C + 1/R_{S1} + 1/R_{S2}.$$

If $R_{S1}$ and $R_{S2}$ are approximately equal to $R_C$, the total resistance R would be ⅓ the value of $R_C$, the resistance of the prior art interconnect via structure.

Figure 7A:
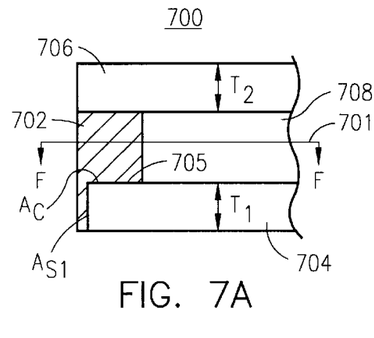
FIGS. 7A & 7B are a side view and the top view, respectively, of the third embodiment of the present invention where the interconnect via structure has a larger cross-section than the underlying metal layer structure and where the interconnect via structure extends down the end of the underlying metal layer structure.
Figure 7B:
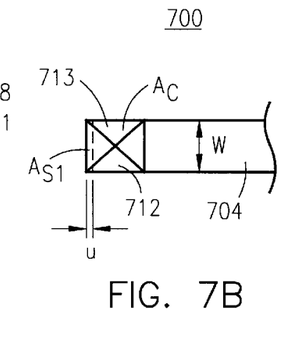
Figure 7C:
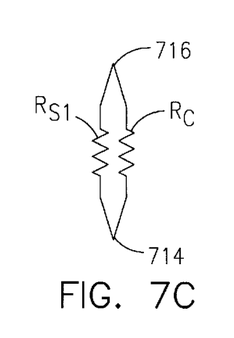
FIG. 7C is a representation of the resistance of the interconnect via structure shown in FIGS. 7A & 7B.

FIGS. 7A & 7B show a side view and the top view, respectively, of a semiconductor device 700 having an interconnect via structure 702 in accordance with a third embodiment of the present invention. The interconnect via structure 702 electrically connects a first metal layer structure 704 to a second metal layer structure 706. The connection between the interconnect via structure 702 and the top surface 705 of the first metal layer structure 704 results in a surface contact area $A_C$. The surface contact area $A_C$ of the structure 700 shown in FIGS. 7A & B corresponds roughly to the surface contact area $A_C$ of the prior art devices shown in FIGS. 2A & B, 3A & B, and 4A & B. The first metal layer structure 704 has a height $T_1$ and the second metal layer 706 has a height $T_2$. The first metal layer structure 704 is electrically insulated from the second metal layer structure 706 by the intermetal dielectric layer 708 except where the interconnect via structure 702 is in electrical contact with the first metal layer structure 704 and the second metal layer structure 706. The interconnect via structure 702 is shown in FIGS. 7A & B extending down the end of the first metal layer structure 704. The extension of the interconnect via structure 702 down the end of the first metal layer structure 704 is substantially to the bottom surface 710 of the first metal layer structure 704 and results in surface contact area $A_{S1}$ between the interconnect via structure 702 and the first metal layer structure 704. The contact surface areas $A_C$ and $A_{S1}$ are approximately equal to W×W and $T_1$×W, respectively, where W is the width of the first metal layer structure 704 and $T_1$ is the height of the first metal layer structure 704. The cross-section of the interconnect via structure 702 is approximately square with dimensions W×W, however, other cross-sectional shapes can be used. Referring to FIG. 7B which is a view of section FF 701 in FIG. 7A, the cross-section 712 (bounded by solid lines) of the interconnect via structure 702 has a larger cross-section than the top surface 713 (bounded by a dashed line on one side) of the first metal layer structure 704. The cross-section 712 of the interconnect via structure 702 is larger in cross-section than the cross-section of the top surface 713 of the first metal layer structure 704 because the interconnect via structure 702 extends beyond the end of the first metal layer structure 704. The amount the interconnect via structure 702 extends beyond the end of the first metal layer 704 is denoted by "u" where u is equal to ¼ to ½ F, where F is a feature of the design rule being used to manufacture the semiconductor device as discussed above in conjunction with FIGS. 5A & B. FIG. 7C indicates that the total resistance of the interconnect via structure 702 is represented by two resistance values connected in parallel between the first metal layer structure 704 and the second metal layer structure 706. The point 714 represents the first metal layer structure 704 and the point 716 represents the second metal layer structure 706. The resistance between the interconnect via structure 702 and the top surface 705 of the first metal layer structure 704 is $R_C$ and the resistance between the interconnect via structure 702 and the end of the first metal layer structure 704 is $R_{S1}$. The total resistance value R between the point 714 and the point 716 in FIG. 7C is calculated as follows:

$$1/R = 1/R_C + 1/R_{S1}.$$

If $R_{S1}$ is approximately equal to $R_C$, the total resistance R would be ½ the value of $R_C$, the resistance of the prior art interconnect via structure.

Figure 8A:
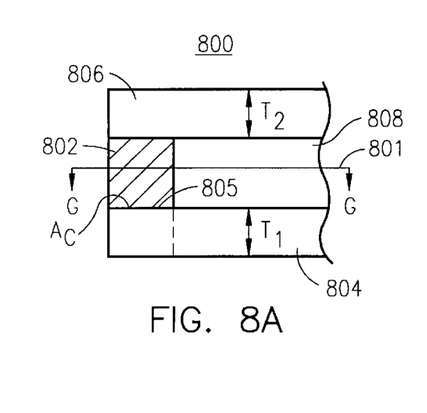
FIGS. 8A & 8B are a side view and the top view, respectively, of the fourth embodiment of the present invention where the interconnect via structure has a larger cross-section than the underlying metal layer structure and where the interconnect via structure extends down one side of the underlying metal layer structure.
Figure 8B:
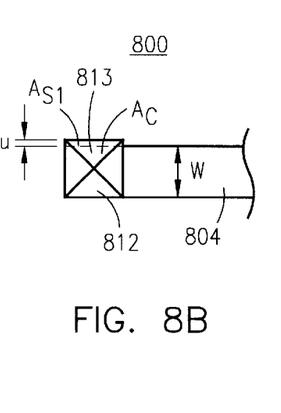
Figure 8C:
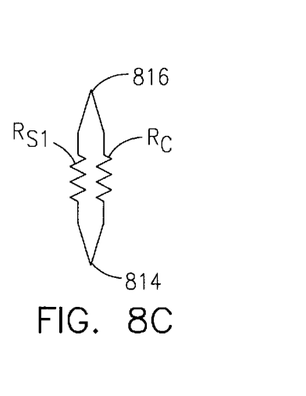
FIG. 8C is a representation of the resistance of the interconnect via structure shown in FIGS. 8A & 8B.

FIGS. 8A & 8B show a side view and the top view, respectively, of a semiconductor device 800 having an interconnect via structure in accordance with a fourth embodiment of the present invention. The interconnect via structure 802 electrically connects a first metal layer structure 804 to a second metal layer structure 806. The connection between the interconnect via structure 802 and the top surface 805 of the first metal layer structure 804 results in a surface contact area $A_C$. The surface contact area $A_C$ of the structure 800 shown in FIGS. 8A & B corresponds roughly to the surface contact area $A_C$ of the prior art devices shown in FIGS. 2A & B, 3A & B, and 4A & B. The first metal layer structure 804 has a height $T_1$ and the second metal layer structure has a height $T_2$. The first metal layer structure 804 is electrically insulated from the second metal layer structure 806 by the intermetal dielectric layer 808 except where the interconnect via structure 802 is in electrical contact with the first metal layer structure 804 and the second metal layer structure 806. The interconnect via structure 802 is shown in FIGS. 8A & B extending down the side of the first metal layer structure 804. The extension of the interconnect via structure 802 down the side of the first metal layer structure 804 is substantially to the bottom surface 810 of the first metal layer structure 804 and results in surface contact area $A_{S1}$ between the interconnect via structure 802 and the first metal layer structure 804. The cross-section of the interconnect via structure 802 is approximately square with dimensions W×W, however, other cross-sectional shapes can be used. Referring to FIG. 8B which is a view of section GG 801 in FIG. 8A, the cross-section 812 (bounded by solid lines) of the interconnect via structure 802 has a larger cross-section than the top surface 813 (bounded by a dashed line on one side) of the first metal layer structure 804. The cross-section 812 of the interconnect via structure 802 is larger in cross-section than the cross-section of the top surface 813 of the first metal layer structure 804 because the interconnect via structure 802 extends beyond one side of the first metal layer structure 804. The amount the interconnect via structure 802 extends beyond the side of the first metal layer 804 is denoted by "u" where u is equal to ¼ to ½ F, where F is a feature of the design rule being used to manufacture the semiconductor device as discussed above in conjunction with FIGS. 5A & B. FIG. 8C indicates that the total resistance of the interconnect via structure 802 is represented by two resistance values connected in parallel between the first metal layer structure 804 and the second metal layer structure 806. The point 814 represents the first metal layer structure and the point 816 represents the second metal layer structure 806. The resistance between the interconnect via structure 802 and the top surface 805 of the first metal layer structure 804 is $R_C$ and the resistance between the interconnect via structure 802 and one side of the first metal layer structure 804 is $R_{S1}$. The total resistance value R between the point 814 and the point 816 in FIG. 8C is calculated as follows:

$$1/R = 1/R_C + 1/R_{S1}.$$

If $R_{S1}$ is approximately equal to $R_C$, the total resistance R would be ½ the value of $R_C$, the resistance of the prior art interconnect via structure.

Figure 9A:
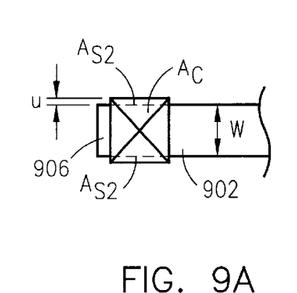
FIGS. 9A & 9B are the top view and a side view, respectively, of the fifth embodiment of the present invention where the interconnect via structure has a larger cross-section than the underlying metal layer structure and where the underlying metal layer structure extends beyond the interconnect via structure.
Figure 9B:
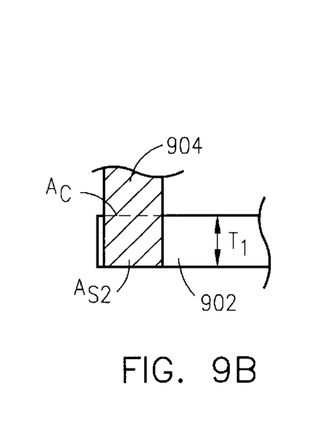

Referring to FIGS. 9A–11B there are shown further embodiments of the present invention. Like identification notations are used to denote like elements as in FIGS. 5A–8C. FIGS. 9A & B show an embodiment of the invention similar to the embodiment shown in FIGS. 6A & B. The difference between the embodiments shown in FIGS. 9A & B and FIGS. 6A & B is that the first metal layer structure 902 extends beyond the interconnect via structure 904 before terminating. The extension indicated at 906 is to reduce the electromigration effect in the interconnect via structure 904. The interconnect via structure 904 extends beyond the first metal layer structure 902 by the value "u" as discussed above in conjunction with the embodiments shown in FIGS. 5A–8B. The total resistance R is calculated to be ⅓ the resistance of $R_C$ as calculated above in conjunction with FIG. 6C.

Figure 10A:
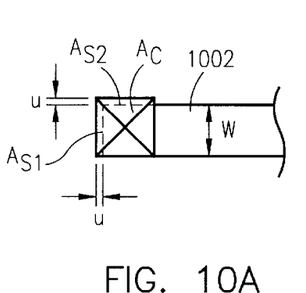
FIGS. 10A & 10B are the top view and a side view, respectively, of the sixth embodiment of the present invention where the interconnect via structure has a larger cross-section than the underlying metal layer structure and where the interconnect via structure extends down one side and down the end of the underlying metal layer structure.
Figure 10B:
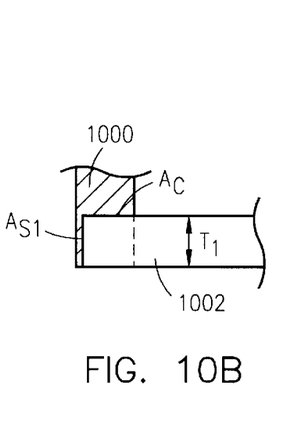

FIGS. 10A & 10B show an embodiment of the invention similar to the embodiment shown in FIGS. 6A & B. The difference is that the interconnect via structure 1000 extends beyond the end and one side of the first metal layer structure 1002. The interconnect via structure 1000 extends beyond the first metal layer structure 1002 by the value "u" as discussed above in conjunction with the embodiments shown in FIGS. 5A–8B. The total resistance R is calculated to be ⅓ the resistance of $R_C$ as calculated above in conjunction with FIG. 6C.

Figure 11A:
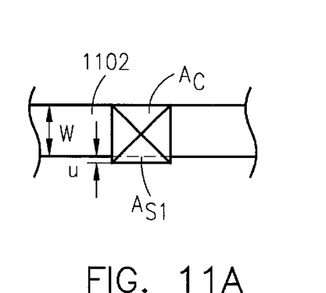
FIGS. 11A & 11B are the top view and a side view, respectively, of the seventh embodiment of the present invention where the interconnect via structure has a larger cross-section than the underlying metal structure and where the interconnect via structure extends down one side of the underlying metal layer structure.
Figure 11B:
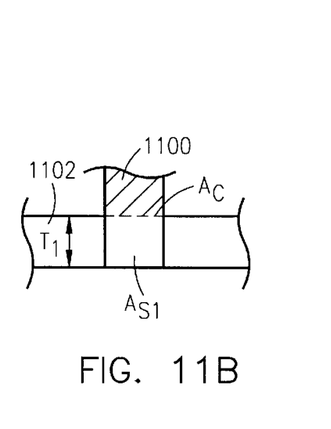

FIGS. 11A & B show an embodiment of the invention similar to the embodiment shown in FIGS. 8A & B. The difference is that the interconnect via structure 1100 is shown at an intermediate position on the first metal layer structure 1102. The interconnect via structure 1100 extends beyond on one side of the first metal layer structure 1102 by the value "u" as discussed above in conjunction with the embodiments shown in FIGS. 5A–8B. The total resistance R is calculated to be ½ the resistance of $R_C$ as calculated above in conjunction with FIG. 8C.

Figure 12A:
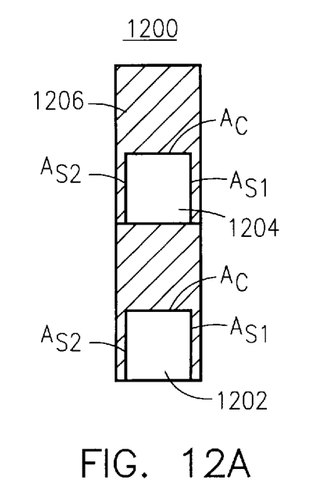
FIG. 12A is a side view of a first stacked via structure and is the eighth embodiment of the present invention where the interconnect via structure extends down the sides of a first metal layer structure and extends to a second metal layer structure underlying the first metal layer and where the interconnect via structure extends down the sides and end of the second metal layer structure.
Figure 12B:
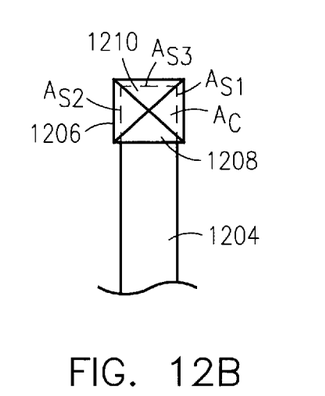
FIG. 12B is the top view of a first embodiment of the first stacked via structure shown in FIG. 12A where the interconnect via structure extends down both sides and the end of each of the first and second metal layer structures.

FIGS. 12A–13C show embodiments of the present invention for "stacked" interconnect via structures. A stacked interconnect via structure is a structure having two or more interconnect via structures "stacked" one on another. FIG. 12A is a side view of a stacked via structure 1200 showing a first metal layer structure 1202, a second metal layer structure 1204, and an interconnect via structure 1206 which extends from above the second metal layer structure 1204, down the sides of the second metal layer structure 1204 to the first metal layer structure 1202 and down the sides of the first metal layer structure 1202. FIG. 12B shows the top view of a first embodiment of the stacked interconnect via structure 1200 in which the interconnect via structure 1206 extends down the end and both sides of the first and second metal layer structures 1202 and 1204. The cross-section 1208 (bounded by solid lines) of the interconnect via structure 1206 has a larger cross-section than the top surface 1210 (bounded by dashed lines on three sides) of the first metal layer 1202 (not shown in FIG. 12B) and the second metal layer structure 1204. The cross-section 1208 of the interconnect via structure 1206 is larger in cross-section than the cross-section of the top surface 1210 of the first and second metal layer structures because the interconnect via structure 1206 extends beyond the end and each side of the first and second metal layer structures. The amount the interconnect via structure 1206 extends beyond the end and sides of the first and second metal layer structures is denoted by "u" where u is equal to ¼ to ½ F, where F is a feature of the design rule being used to manufacture the semiconductor device as discussed above in conjunction with FIGS. 5A & B. The total resistance R of the interconnect via structure 1206 between one metal layer structure and an adjacent metal layer structure would be calculated as discussed above in conjunction with FIG. 5A–C. The total resistance R would be equal to approximately ¼ the value of $R_C$, the resistance of the equivalent prior art device.

Figure 12C:
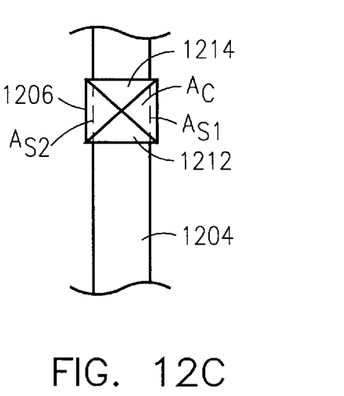
FIG. 12C is the top view of a second embodiment of the first stacked via structure shown in FIG. 12A where the interconnect via structure extends down both sides of each of the first and second metal layer structures.

FIG. 12C shows the top view of a second embodiment of the stacked interconnect via structure 1200 in which the interconnect via structure 1206 extends down both sides of the first and second metal layer structures 1202 and 1204. The cross-section 1212 (bounded by solid lines) of the interconnect via structure 1206 has a larger cross-section than the top surface 1214 (bounded by dashed lines on two sides) of the first metal layer 1202 (not shown in FIG. 12C) and the second metal layer structure 1204. The cross-section 1212 of the interconnect via structure 1206 is larger in cross-section than the cross-section of the top surface 1214 of the first and second metal layer structures because the interconnect via structure 1206 extends beyond each side of the first and second metal layer structures. The amount the interconnect via structure 1206 extends beyond the sides of the first and second metal layer structures is denoted by "u" where u is equal to ¼ to ½ F, and where F is a feature of the design rule being used to manufacture the semiconductor device as discussed above in conjunction with FIGS. 5A & B. The total resistance R of the interconnect via structure 1206 between one metal layer structure and an adjacent metal layer structure would be calculated as discussed above in conjunction with FIG. 6A–C. The total resistance R would be equal to approximately ⅓ the value of $R_C$, the resistance of the equivalent prior art device.

FIG. 13A is a side view of a stacked via structure 1300 showing a first metal layer structure 1302, a second metal layer structure 1304, and an interconnect via structure 1306 which extends from above the second metal layer structure 1304, down the side of the second metal layer structure 1304 to the first metal layer structure 1302 and down the side of the first metal layer structure 1302. FIG. 13B shows the top view of a first embodiment of the stacked interconnect via structure 1300 in which the interconnect via structure 1306 extends down the end and one side of the first and second metal layer structures 1302 and 1304. The cross-section 1308 (bounded by solid lines) of the interconnect via structure 1306 has a larger cross-section than the top surface 1310 (bounded by dashed lines on two sides) of the first metal layer 1302 (not shown in FIG. 13B) and the second metal layer structure 1304. The cross-section 1308 of the interconnect via structure 1306 is larger in cross-section than the cross-section of the top surface 1310 of the first and second metal layer structures because the interconnect via structure 1306 extends beyond the end and one side of the first and second metal layer structures. The amount the interconnect via structure 1306 extends beyond the end and sides of the first and second metal layer structures is denoted by "u" where u is equal to ¼ to ½ F, where F is a feature of the design rule being used to manufacture the semiconductor device as discussed above in conjunction with FIGS. 5A & B. The total resistance R of the interconnect via structure 1306 between one metal layer structure and an adjacent metal layer structure would be calculated as discussed above in conjunction with FIG. 5A–C. The total resistance R would be equal to approximately ⅓ the value of $R_C$, the resistance of the equivalent prior art device.

FIG. 13C shows the top view of a second embodiment of the stacked interconnect via structure 1300 in which the interconnect via structure 1306 extends down one side of the first and second metal layer structures 1302 and 1304. The cross-section 1312 (bounded by solid lines) of the interconnect via structure 1306 has a larger cross-section than the top surface 1314 (bounded by dashed lines on one side) of the first metal layer 1302 (not shown in FIG. 13C) and the second metal layer structure 1304. The cross-section 1312 of the interconnect via structure 1306 is larger in cross-section than the cross-section of the top surface 1314 of the first and second metal layer structures because the interconnect via structure 1306 extends beyond one side of the first and second metal layer structures. The amount the interconnect via structure 1306 extends beyond the sides of the first and second metal layer structures is denoted by "u" where u is equal to ¼ to ½ F, and where F is a feature of the design rule being used to manufacture the semiconductor device as discussed above in conjunction with FIGS. 5A & B. The total resistance R of the interconnect via structure 1306 between one metal layer structure and an adjacent metal layer structure would be calculated as discussed above in conjunction with FIG. 7A–C. The total resistance R would be equal to approximately ½ the value of $R_C$, the resistance of the equivalent prior art device.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What I claim is:

1. An interconnect via structure in a semiconductor integrated circuit having at least two metal layer structures wherein a second metal layer structure overlies a first metal layer structure and wherein the first metal layer structure has a top surface and a bottom surface, wherein the interconnect via structure comprises an electrically conductive material in electrical contact with the second metal layer structure and in electrical contact with the top surface of the first metal layer structure and wherein the electrically conductive material extends down a first side of the first metal layer structure to substantially the bottom surface of the first metal layer structure and wherein the electrically conductive material extends above a top surface of the second metal layer structure.

2. The interconnect via structure of claim 1, wherein the electrically conductive material extends down a first side of the second metal layer structure.

3. The interconnect via structure of claim 2, wherein the electrically conductive material extends down a second side of the second metal layer structure.

4. The interconnect via structure of claim 3, wherein the electrically conductive material extends down an end of the second metal layer structure.

5. The interconnect via structure of claim 4, wherein the electrically conductive material extends beyond the first side of the second metal layer structure by a distance equal to ¼ to ½ F where F is equal to the design rule being used to manufacture the semiconductor device.

6. The interconnect via structure of claim 5, wherein the electrically conductive material extends beyond the second side of the second metal layer structure by a distance equal to ¼ to ½ F where F is equal to the design rule being used to manufacture the semiconductor device.

7. The interconnect via structure of claim 6, wherein the electrically conductive material extends beyond the end of the second metal layer structure by a distance equal to ¼ to ½ F where F is equal to the design rule being used to manufacture the semiconductor device.

8. The interconnect via structure of claim 7, wherein the resistance between the interconnect via structure and the second metal layer structure is determined by:

$$1/R = 1/R_C + \Sigma 1/R_{Si};$$

where R is the total resistance between the interconnect via structure and the second metal layer structure, $R_C$ is the resistance between the top surface of the second metal layer structure and the interconnect via structure, and $R_{Si}$ is the resistance between side i of the second metal layer structure and the interconnect via structure.

* * * * *